United States Patent [19]

Ishikawa

[11] Patent Number: 4,874,907
[45] Date of Patent: Oct. 17, 1989

[54] PRINTED CIRCUIT BOARD
[75] Inventor: Norio Ishikawa, Kanagawa, Japan
[73] Assignee: Mitsubishi Denki K.K., Tokyo, Japan
[21] Appl. No.: 196,603
[22] Filed: May 20, 1988
[30] Foreign Application Priority Data
   Jun. 5, 1987 [JP] Japan .............................. 62-87224[U]
[51] Int. Cl.$^4$ .............................................. H05K 1/00
[52] U.S. Cl. .................................. 174/68.5; 361/403; 361/406
[58] Field of Search ............... 174/685, 255, 260, 261, 174/264; 361/403, 406, 417, 418

[56] References Cited
U.S. PATENT DOCUMENTS 3,742,597  7/1973  Davis .............................. 174/68.5 X
4,413,309  11/1983 Takahashi et al. ............. 174/68.5 X
4,521,262  6/1985  Pellegrino ....................... 174/68.5 X
4,785,141  11/1988 Nishihara et al. ................. 174/68.5

FOREIGN PATENT DOCUMENTS 55-181374  12/1980  Japan .
58-177961  11/1983  Japan .
58-189567  12/1983  Japan .
62-098254   6/1987  Japan .

Primary Examiner—Morris H. Nimmo
Attorney, Agent, or Firm—Kanesaka & Takeuchi

[57] ABSTRACT

A signal output land to which no solder-resist liquid is applied, is provided on a portion of the wiring pattern of a printed circuit board. The printed circuit board thus made may be inspected by merely contacting the terminal of a measuring instrument with the signal output land.

4 Claims, 1 Drawing Sheet

PRINTED CIRCUIT BOARD

BACKGROUND OF THE INVENTION

The present invention relates to printed circuit boards capable of mounting thereon a plurality of electronic components with high density.

This kind of printed circuit boards is disclosed in Japanese U.M. Patent Kokai No. 55-181374. As shown in FIG. 2, this printed circuit board includes a pair of component connection lands 2 and 3 across which a pair of ends 10a and 10b of an electronic component 10 are connected, a pair of signal output lands 12 and 13 each communicating with the connection land, and a pair of wiring patterns 1 and 4 each communicating with the connection land.

The ends 10a and 10b of the electronic component 10 are soldered to the connection lands 2 and 3 by applying a solder resist liquid to the printed circuit board except for the connection lands 2 and 3 and the output lands 12 and 13 and solder to the connection lands 2 and 3 and the output lands 12 and 13.

On the above printed circuit board, however, the signal output lands 12 and 13 must be placed continuously next to the component connection lands 2 and 3, thus limiting the number of electronic components 10 mounted.

In addition, as the number of electronic components increases, so does the number of connection lands to which the electronic components are to be connected, thus increasing the density of the connection lands on the printed circuit board. As a result, it has been difficult or impossible to place a signal output land continuously to the component connection land.

SUMMARY OF THE INVENTION

Accordingly, it is an object of the invention to provide a printed circuit board which is easy to inspect even when a great number of electronic components are mounted thereon.

According to the invention, the above object is accomplished by providing on a portion of the wiring pattern a signal output land to which no solder-resist liquid is applied. The printed circuit board thus made may be inspected by merely contacting the terminal of a measuring instrument with the signal output land.

Other objects, features, and advantages of the invention will be apparent from the following description taken in conjunction with the accompanying drawings.

DESCRIPTION OF THE PREFERRED EMBODIMENT

Figure 1:
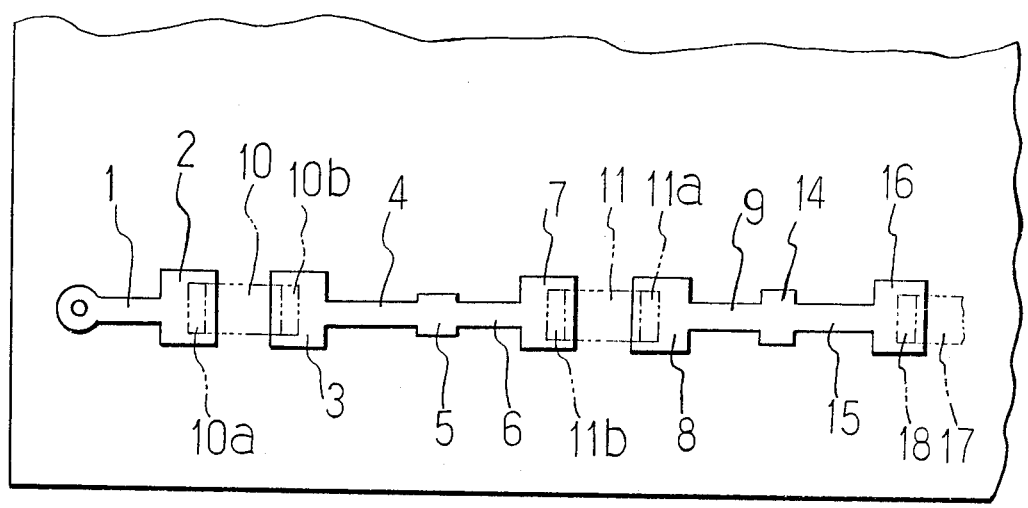
FIG. 1 is a plan view of a printed circuit board according to an embodiment of the invention.
Figure 2:
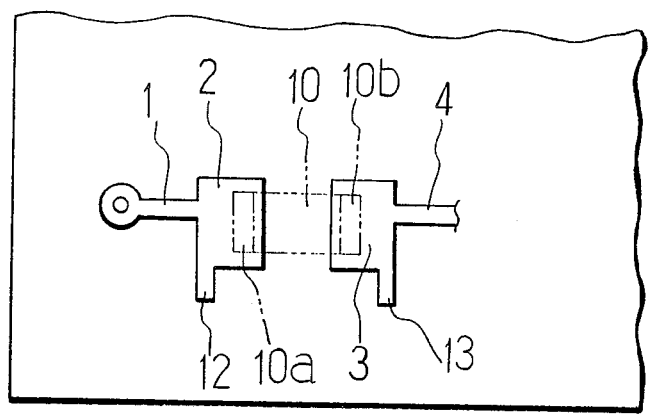
FIG. 2 is a plan view of a printed circuit board according to the prior art.

An embodiment of the invention will be described with reference to FIG. 1. Like reference numerals designate like or corresponding parts of the above prior art, and their description will be omitted.

On the printed circuit board according to the invention, first and second electronic components 10 and 11 are spaced at a certain interval. An end 10b of the first electronic component 10 is connected to a first component connection land 3, to which an end of a wiring pattern 4 is connected. The other end 10a of the first electronic component 10 is connected to a connection land 2, to which an end of a wiring pattern 1 is connected.

The ends 10a and 10b of the first electronic component 10 have been soldered by applying a solder-resist liquid to the printed circuit board except the connection lands 2 and 3 and then applying solder to the connection lands 2 and 3.

Meanwhile, an end 11b of the second electronic component 11 is soldered to a second component connection land 7 in the same way as the end 10a of the first electronic component 10. The connection land 7 communicates with an end of a wiring pattern 6. To link the connection lands 3 and 7, the other end of the wiring pattern 6 is communicated to the other end of the wiring patter 4 via a signal output land 5 to which no solder-resist liquid is applied.

The output land 5 is placed at a joint of the wiring patterns 4 and 6 of substantially equal lengths and has a rectangular shape whose width is greater than those of the wiring patterns 4 and 6. The other end 11a of the second electronic component 11 is connected to a component connection land 8, with which an end of a wiring pattern 9 is communicated. The other end of the wiring pattern 9 is communicated with a signal output land 14 similar to the signal output land 5, with which an end of a wiring pattern 15 is communicated. The other end of the wiring pattern 15 is communicated with an end of a connection land 16, to which an end 18 of an electronic component 17 is connected.

The operation will be described. With the above structure that a signal output land is placed on a portion of a wiring pattern, the needle-like terminal of an instrument may be contacted with the signal output land without difficult even when the number of connection lands and the density thereof increases. Consequently, it is unnecessary to contact the above terminal with connection lands or ends of an electronic component whose mounting position is not always constant.

It is to be understood that the shape of the signal output land is not limited to rectangular as illustrated above but may be round. The output land may also be disposed at any appropriate portion of the wiring pattern other than its center as illustrated above.

As has been described above, according to the invention, a signal output land to which no solder-resist liquid is applied, is provided on a portion of the wiring pattern, thus eliminating the need for providing a signal output land next to the connection land. Since no signal output land is attached to the component connection land, an increase in the area of the component connection land is prevented, which, in turn, prevents a decrease in the number of electronic components mounted.

While a preferred embodiment of the invention has been described using specific terms, such description is for illustrative purposes only, and it is to be understood that variations and changes may be made without departing from the spirit and scope of the invention as recited in the following claims.

What is claimed is:

1. A printed circuit board comprising:
   a substrate;
   a first component connection land provided on a surface of said substrate, to which an end of a first electronic component is to be connected;

a second component connection land provided on said surface, to which an end of a second electronic component is to be connected, a wiring pattern provided on said surface to link said first and second component connection lands;

a signal output land made from a portion of said wiring pattern; and a solder-resist layer for covering said printed circuit board except for said first, second, and signal output lands.

2. The printed circuit board of claim 1, wherein said signal output land is formed as an expanded area which is wider than said wiring pattern.

3. A printed circuit board for mounting a series of leadless components, which comprises:

a dielectric substrate;

a plurality of component connection lands for said leadless components aligned on said surface at predetermined intervals;

a plurality of wiring patterns provided on said surface to each connect a pair of adjacent said component connection lands; and a signal output land made from a portion of each said wiring pattern and having no through hole, with which a test instrument may be brought into contact to check soldering conditions of said leadless components to said component connection lands.

4. The printed circuit board of claim 3, which further comprises a solder resist layer provided over said printed circuit board except for said component connection lands and said signal output lands.

* * * * *